Figure 1:
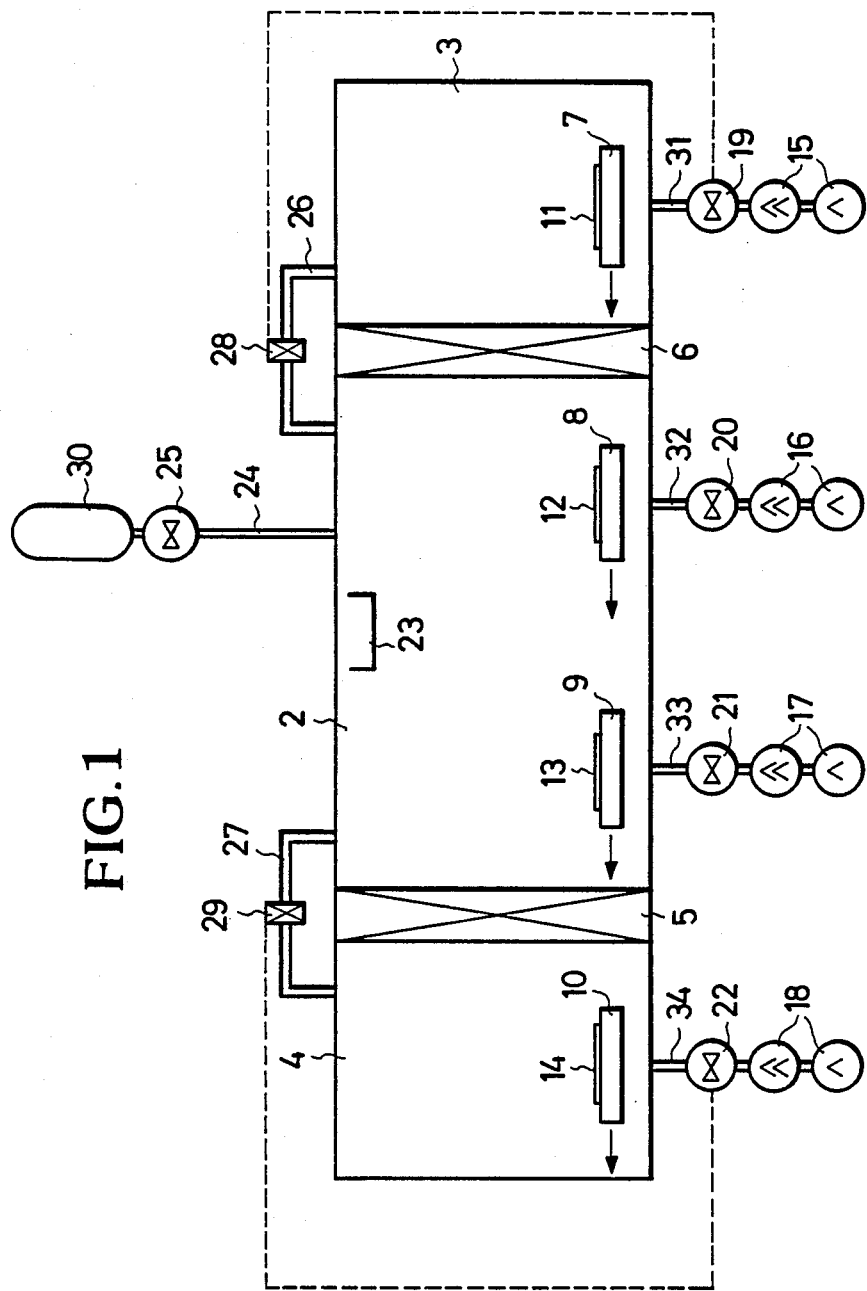

United States Patent [19]

Arnold et al.

[11] Patent Number: 4,824,545
[45] Date of Patent: Apr. 25, 1989

[54] APPARATUS FOR COATING SUBSTRATES

[75] Inventors: Manfred Arnold, Aschaffenburg; Peter Wirz, Waldernbach, both of Fed. Rep. of Germany

[73] Assignee: Leybold Aktiengesellschaft, Cologne, Fed. Rep. of Germany

[21] Appl. No.: 134,362

[22] Filed: Dec. 17, 1987

[30] Foreign Application Priority Data

Sep. 18, 1987 [DE] Fed. Rep. of Germany ....... 3731444

[51] Int. Cl.$^4$ ............................................. C23C 14/56
[52] U.S. Cl. .................................... 204/298; 118/719; 118/723
[58] Field of Search ................ 204/298 MC; 118/719, 118/733

[56] References Cited
U.S. PATENT DOCUMENTS 3,822,200  7/1974  Endo ................................... 204/298

Primary Examiner—Aaron Weisstuch
Attorney, Agent, or Firm—Felfe & Lynch

[57] ABSTRACT

An apparatus for coating substrates in a vacuum chamber has a cathode system, which is preceded and followed by evacuable isolating chambers. The individual chambers can be separated from one another by locks, and the apparatus has a conduit leading into the coating chamber for feeding one or more process gases. Transport frames carry the substrates through the individual chambers on rails and/or wheels. In such an apparatus one or more bypass lines are provided which connect the coating chamber to the isolating chambers preceding or following it, and a shutoff or valve is inserted into each bypass line and brings about an equalization of pressure between the chambers. By means of a pressure equalization performed in this manner, the constancy of the gas concentrations which is essential in a reactive process to the stability of the process and to uniform coating properties, is automatically assured.

3 Claims, 2 Drawing Sheets

APPARATUS FOR COATING SUBSTRATES

BACKGROUND OF THE INVENTION

The invention relates to an apparatus for coating substrates in a vacuum chamber having a cathode system or an evaporating system, which is preceded and followed by evacuable isolated chambers, the individual chambers being separable from one another by locks. In this apparatus a conduit leads into the coating chamber to supply one or more process gases, and carrier frames carrying the substrates to be coated are held and guided on rails and/or wheels and can be moved through the individual chambers.

An apparatus of the kind in question is known (EP No. 00 28 690) in which a plurality of isolated chambers are disposed in front of and behind a central coating chamber, and all of the chambers communicate through locks. The carrier frames for mounting the tabular workpieces consist of perpendicularly disposed plates each of which is equipped with a base having rollers or skids which run on a track or conveyor belt which is laid on the floor of the chambers. The locks, which separate the individual chambers from one another, are configured as rectangular flaps, and are of such dimensions that the perpendicular, tabular holders or frames with the workpieces, e.g., glass sheets, lying against them can be moved straight through the openings in the walls separating the chambers, which are uncovered by the flaps. The transport of the workpieces takes place step-wise, i.e., when all of the frames or holders mounted on the rail are simultaneously moved on chamber forward, all flaps hermetically seal off the chambers and the frames with the workpieces remain in the chambers in question for the duration of a coating operation. The entry and exit lock chambers are, like the coating chamber, connected to vacuum pumps so that the pressure in the chambers can be kept at the same level. This apparatus has the disadvantage that, when a coating operation is performed in a reactive gas atmosphere, upon each passage through a lock, i.e., upon each opening and closing of the locks between the coating chamber and the adjoining isolating chamber, the gas concentrations are altered, which then leads to irregular coating qualities, since, on the one hand, the amount of the reactive gas that is contained in the mixture of reactive gas and inert gas necessary for the process and is consumed by the reaction is of decisive importance, while on the other hand it is precisely this parameter that cannot be controlled either by pressure measurements or by flow measurements.

It is therefore the object of the present invention to create an apparatus of the kind in question, in which the process can be kept always in the same reactive state, even in dynamic operation, i.e., with substrates moving past the cathode or evaporating system, so that the coating thickness and quality will have a high degree of uniformity from substrate to substrate.

According to the invention this is achieved by one or more bypass conduits joining the coating chamber to the chamber preceding or following it, a valve or shut-off being inserted in each bypass line by which pressure equalization between the chambers can be brought about.

Preferably for this purpose valves are inserted into the suction lines connecting the chambers to the vacuum pump stands and are operated in synchronism with the valves in the bypass lines such that a closing of one valve of the exhaust line or of the particular isolation chamber produces the simultaneous or time-delayed opening of the valve in the corresponding bypass line.

By a pressure equalization performed in this manner between process and isolating chambers the assurance is automatically provided that, even during the passage of the substrate holders through the locks, the individual gas concentrations at the cathode remain constant, which is of decisive importance to the stability of the process and to the constancy of the properties of the coating.

To permit a fully automated operation, the valve regulating the flow of reactive gas into the coating chamber is coupled by a control line to the apparatus that supplies electrical energy to the cathode system, while the parameters characterizing the process, such as cathode voltage or, alternatively, cathode current, are kept constant by controlling the amount of reactive gas flowing into the coating chamber.

Figure 2:
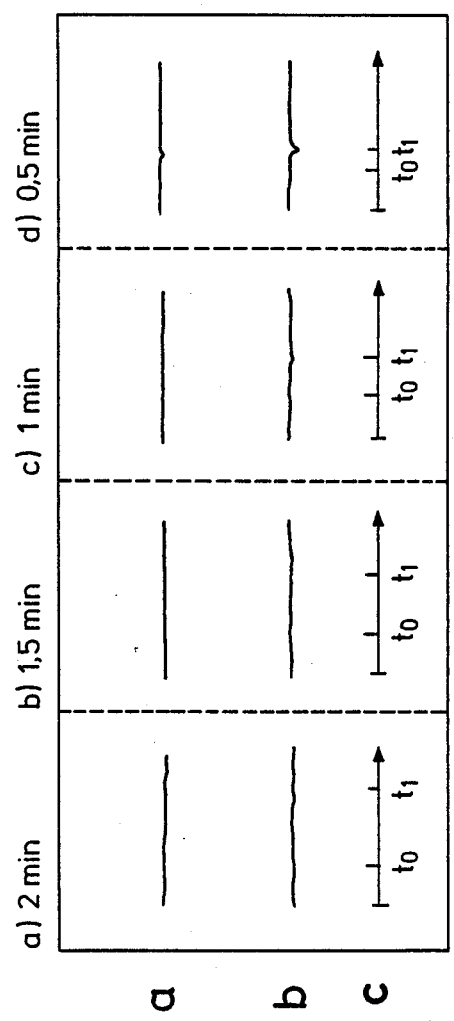

The invention permits a great variety of embodiments; one of them is shown in detail in the appended drawing wherein:

FIG. 1 is the purely diagrammatic representation of an apparatus for coating substances mounted on movable frames, with a coating chamber, an entrance lock chamber and an exit lock chamber associated therewith, and with bypass lines connecting the adjacent chambers, and FIG. 2 shows the influence, represented in the graphs, of the pressure equalization produced through the bypass line between the entrance lock chamber and the coating chamber on different process parameters.

The apparatus consists essentially of a coating chamber 2, an entrance lock chamber 3 preceding it, and an exit lock chamber 4 following it; also of the locks 5 and 6 disposed between the coating chamber 2 and the chambers 3 and 4, the transport frames 7 to 10 moving on a train of rollers not further indicated and provided for the substrates 11 to 14 which are to be coated, a plurality of vacuum pump means 15 to 18 connected to the chambers 2, 3 and 4, by means of lines 31 to 34 and shut-offs 19 to 22 associate with each one thereof, a cathode system 23 present in the coating chamber, a tank 30 for inert gas and reactive gas connected to the coating chamber through shut off 25 by a line 24, and the two bypass lines 26 and 27 connecting the coating chamber 2 to the entrance lock chamber 3 and the exit lock chamber 4, respectively, with the shutoffs 28 and 29 inserted in these bypass lines 26 and 27.

The cathode 23 is in reactive operation in the coating chamber 2. For this it is necessary that a defined mixture of inert gas and reactive gas be always present in the coating chamber. The stoichiometry of the coatings sputtered onto the substrates 11 to 14 is determined by the state of the cathode 23. The percentage of the reactive gas is the deciding parameter for this. Usually the admission of the reactive gas through line 24 is controlled so that the cathode voltage is kept constant by it ($U_{cathode}$=const., $U_{cathode}$ being a function of the flow of the reactive gas).

The coating process is to be kept always in the same reactive condition, not only in the static state of operation, but also in the dynamic operating state in which the transport frames 7 to 10 are moving past the cathode system 23, so as to assure constant coating properties from substrate 11 to substrate 14. The entrance lock chamber 3, whose function consists in separating the various processes from one another, is installed in front of the coating chamber. Crosstalk from one process chamber to others is prevented by the fact that the transport frame stops briefly in the entrance lock chamber 3 or exit lock chamber 4 and during this period this chamber is evacuated to a high vacuum with locks 5 and 6 to coating chamber 2 closed. During the entrance through the lock into the next chamber, the reactive process must not be affected by the opening of lock 5 or 6. For this purpose a pressure equalization is to be performed between the entrance and exit lock chambers 3 and 4 on the one hand and the coating chamber 2 on the other.

For this purpose the pressure or the reactive gas flow in the coating chamber 2 can be measured, in which case the same pressure or gas flow is to be produced in the entrance lock chamber 3 before entry through the lock. The relevant parameter is, of course, the amount of reactive gas that is consumed by the reaction. This amount, however, can be controlled neither by pressure measurements nor by flow measurements.

A precise pressure equalization between the coating chamber and the entrance lock chamber 3 without changing the gas concentrations at the cathode is achieved through the bypass line 26. In the entrance lock chamber 3, before the lock 6 is opened, the valve 19 to the vacuum pump stand 15 is closed and, simultaneously or with a time delay, the shut-off 28 of the bypass line 26 is opened. Through this bypass line a "gentler" pressure equalization takes place between the two chambers 2 and 3. At the same time the correct mixture of inert gas and reactive gas is admitted into the entrance lock chamber 3, so that, after equalization has been performed and the lock 6 is opened, neither a pressure shock nor a change of the gas mixture will change the process parameters, i.e., specifically, the state of the cathode 23. By this measure assurance is provided that the transport frames 7 to 10 can run continuously without affecting the coating properties.

FIG. 2 illustrates the experimental results which show the influence of this measure on the pressure and cathode voltage, A representing the cathode voltage, B the sputtering pressure and C the equalization time.

The effect of the pressure equalization on the relevant process parameters (cathode voltage $U_c$ and sputtering pressure p) is shown for different periods of the opening of the bypass lines 26 and 27 (0.5 min–2 min). On the time line to the moment $t_0$ of the opening of the lock is given. It can be seen that when the equalization time $t_0$–$t_1$ during which the valves 28 and 29 of bypass lines 26 and 27, respectively, are opened, is more than 1 minute, it has no effect whatever on cathode voltage or pressure in the process chamber. Such timing is also assured in dynamic operation. Only in the case of an equalization time $t_0$–$t_1$ equal to 0.5 minutes is there any marked break in pressure (p=$3 \times 10^{-4}$ mbar) and voltage ($U_c$=2–3 V). The opening of the bypass valve 28 or 29 generally has no effect on the reactive process on account of the low conductivity of the bypass line 26 or 27, respectively.

We claim:

1. Apparatus for coating substrates in a vacuum chamber having a cathode system or an evaporating system which is preceded and followed by evacuable isolating chambers, the individual chambers being separable from one another by locks, with a conduit leading into the coating chamber for feeding one or more process gases, and with transport frames for holding the substrates to be coated, which frames are movable through the individual chambers while held and guided on rails and/or wheels, characterized by one or more bypass conduits (26, 27) which connect the coating chamber (2) to the chamber (3 or 4) that precedes or follows it, a shutoff means or valve being inserted into each bypass conduit, by which a pressure equalization between the chambers (2, 3 or 2, 4, respectively) can be controlled, whereby the constancy of the ratio of admixture of inert gas and reactive gas, which is essential to the stability of a reactive process going on in the process chamber (2), is automatically assured even when the locks (5 or 6) are opened for the advancement of the transport frames (7 to 10) laden with the substrates (11–14) to be coated, so that the coating properties are held constant during dynamic coating operation.

2. Apparatus according to claim 1, characterized in that valves (19 to 22) are inserted into the suction conduits (31 to 34) connecting the chambers (2, 3, 4) to their respective vacuum pumps (15 to 18), which are operated synchronously with the valves (28, 29) in the bypass conduits (26, 27) such that closing a valve (19 or 22) in the suction line (31 or 34) of the isolating chamber (3 or 4) produces a simultaneous or delayed opening of a valve (28 or 29) in the corresponding bypass conduit.

3. Apparatus according to claim 1, characterized in that a valve (25) controlling the input of reactive gas into the coating chamber (2) is coupled through a control line to the apparatus supplying the cathode system (23) with electrical energy, parameters characterizing the process, including cathode voltage and current may be kept constant through the amount of reactive gas flowing into the coating chamber (2).

* * * * *